United States Patent
Park et al.

(10) Patent No.: US 10,566,137 B2
(45) Date of Patent: Feb. 18, 2020

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Se Hun Park, Suwon-si (KR); Gu Won Ji, Suwon-si (KR); Heung Kil Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/856,590

(22) Filed: Dec. 28, 2017

(65) Prior Publication Data

US 2019/0103221 A1    Apr. 4, 2019

(30) Foreign Application Priority Data

Oct. 2, 2017  (KR) .......................... 10-2017-0128505

(51) Int. Cl.
| | |
|---|---|
| *H01G 4/30* | (2006.01) |
| *H01G 4/232* | (2006.01) |
| *H01G 4/228* | (2006.01) |
| *H01G 4/12* | (2006.01) |
| *H01G 4/01* | (2006.01) |

(Continued)

(52) U.S. Cl.
CPC .................. *H01G 4/12* (2013.01); *H01G 2/06* (2013.01); *H01G 4/01* (2013.01); *H01G 4/224* (2013.01); *H01G 4/30* (2013.01); *H05K 1/0271* (2013.01)

(58) Field of Classification Search
CPC .......... H01G 4/30; H01G 4/232; H01G 4/228; H01G 4/12; H01G 4/01; H01G 2/06; H01G 4/224
USPC ............ 361/301.4, 306.1, 321.1, 306.3, 309, 361/321.2, 321.3
See application file for complete search history.

(56) References Cited

U.S. PATENT DOCUMENTS

2008/0310077 A1\*  12/2008  Itamura ................. H01G 4/228
                                                                361/306.3
2014/0016242 A1      1/2014  Hattori et al.
(Continued)

FOREIGN PATENT DOCUMENTS

| JP | 2012-204572 A | 10/2012 |
|---|---|---|
| KR | 10-2015-0118385 | 10/2015 |
| KR | 10-2015-0127965 A | 11/2015 |

*Primary Examiner* — Eric W Thomas
*Assistant Examiner* — Arun Ramaswamy
(74) *Attorney, Agent, or Firm* — Morgan, Lewis & Bockius LLP

(57) ABSTRACT

A multilayer electronic component includes: a capacitor body including an active region including first and second internal electrodes and upper and lower cover regions; first and second external electrodes including first and second connected portions connected to the first and second internal electrodes and first and second band portions, respectively; and first and second bump terminals having conductive layers and disposed on the first and second band portions, respectively, wherein BW/3≤G≤BW and T/5<ET<T/2, where BW is a width of each of the first and second band portions, T is a thickness of each of the first and second connected portions, G is a width of each of the first and second bump terminals, and ET is a thickness of each of the first and second bump terminals.

19 Claims, 7 Drawing Sheets

(51) Int. Cl.
*H01G 4/224* (2006.01)
*H01G 2/06* (2006.01)
*H05K 1/02* (2006.01)

(56) References Cited

U.S. PATENT DOCUMENTS

| | | | | |
|---|---|---|---|---|
| 2014/0345926 A1* | 11/2014 | Lee | ................. | H01G 4/30 |
| | | | | 174/260 |
| 2015/0124370 A1* | 5/2015 | Ahn | ................. | H01G 4/224 |
| | | | | 361/272 |
| 2016/0049245 A1* | 2/2016 | Kitano | ................. | H01G 4/30 |
| | | | | 361/301.4 |

* cited by examiner

MULTILAYER ELECTRONIC COMPONENT AND BOARD HAVING THE SAME

CROSS-REFERENCE TO RELATED APPLICATION(S)

This application claims the benefit of priority to Korean Patent Application No. 10-2017-0128505, filed on Oct. 2, 2017 in the Korean Intellectual Property Office, the disclosure of which is incorporated herein by reference in its entirety.

BACKGROUND

1. Field

The present disclosure relates to a multilayer electronic component and a board having the same.

2. Description of Related Art

A multilayer capacitor, a multilayer electronic component, is formed of a dielectric material, and such a dielectric material may have piezoelectric properties to be thus synchronized and deformed with a voltage applied thereto.

When a period of the applied voltage is within an audio frequency band, displacement of the dielectric material becomes vibrations to be transferred to a circuit board through solders, and vibrations of the circuit board are thus experienced as noise. Such noise is known as acoustic noise.

In a case in which a device is operated in a quiet environment, a user may experience the acoustic noise as abnormal sound and believe that a fault has occurred in the device.

In addition, in a device having an audio circuit, the acoustic noise may overlap an audio output, such that quality of the device may be deteriorated.

In addition, in a case in which piezoelectric vibrations of the multilayer capacitor are generated in a high frequency region of 20 kHz or more, separately from the acoustic noise recognized by a user, malfunctioning of various sensors used in information technology (IT) and industry/electrical component fields may be caused.

Meanwhile, external electrodes of the multilayer capacitor and the circuit board are connected to each other by solders. In this case, the solders may be formed in an inclined state at a predetermined height along surfaces of the external electrodes on opposite side surfaces or opposite end surfaces of a capacitor body.

Here, as a volume and a height of the solders are increased, the vibrations of the multilayer capacitor are more easily transferred to the circuit board, such that a magnitude of the generated acoustic noise is increased.

Recently, due to a decrease in noise in components of electronic devices, acoustic noise generated in a multilayer electronic component may be more prominent.

SUMMARY

An aspect of the present disclosure may provide a multilayer electronic component capable of reducing acoustic noise and high frequency vibrations in a high frequency region of 20 KHz or more, and a board having the same.

According to an aspect of the present disclosure, a multilayer electronic component may include: a capacitor body having first and second surfaces opposing each other and third and fourth surfaces connected to the first and second surfaces and opposing each other, and including an active region including first and second internal electrodes disposed to be alternately exposed through the third and fourth surfaces, respectively, with respective dielectric layers interposed therebetween and upper and lower cover regions disposed on upper and lower surfaces of the active region, respectively; first and second external electrodes including, respectively, first and second connected portions disposed on the third and fourth surfaces of the capacitor body, respectively, and connected to the first and second internal electrodes, respectively, and first and second band portions extending from the first and second connected portions to portions of the first surface; and first and second bump terminals formed of insulators, having conductive layers formed on surfaces thereof, and disposed on the first and second band portions, respectively, wherein $BW/3 \leq G \leq BW$ and $T/5 < ET < T/2$, where BW is a width of each of the first and second band portions, T is a thickness of each of the first and second connected portions, G is a width of each of the first and second bump terminals, and ET is a thickness of each of the first and second bump terminals.

The lower cover region may have a thickness greater than that of the upper cover region.

The thickness of the lower cover region may be less than than two times of that of the upper cover region.

The first external electrode may extend to portions of the second surface and fifth and sixth surfaces of the capacitor body, and the second external electrode may extend to portions of the second, fifth, and sixth surfaces of the capacitor body.

The composite electronic component may further include first and second insulating layers disposed on the first and second connected portions, respectively.

The composite electronic component may further include an encapsulating portion covering the capacitor body and the first and second external electrodes.

The first and second bump terminals may be disposed to be spaced apart from the first and second connected portions, respectively.

Step portions may be provided on the first and second band portions between the first and second bump terminals and the first and second connected portions, respectively.

The multilayer electronic component may satisfy $W/2 < EW < W$, where W is a width of each of the first and second connected portions and EW is a length of each of the first and second bump terminals.

The conductive layers may be formed by plating.

The first and second bump terminals may be formed of insulation epoxy.

According to another aspect of the present disclosure, a board having a multilayer electronic component may include: a circuit board having first and second electrode pads disposed thereon; and the multilayer electronic component as described above disposed on the circuit board so that the first and second bump terminals are connected to the first and second electrode pads, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
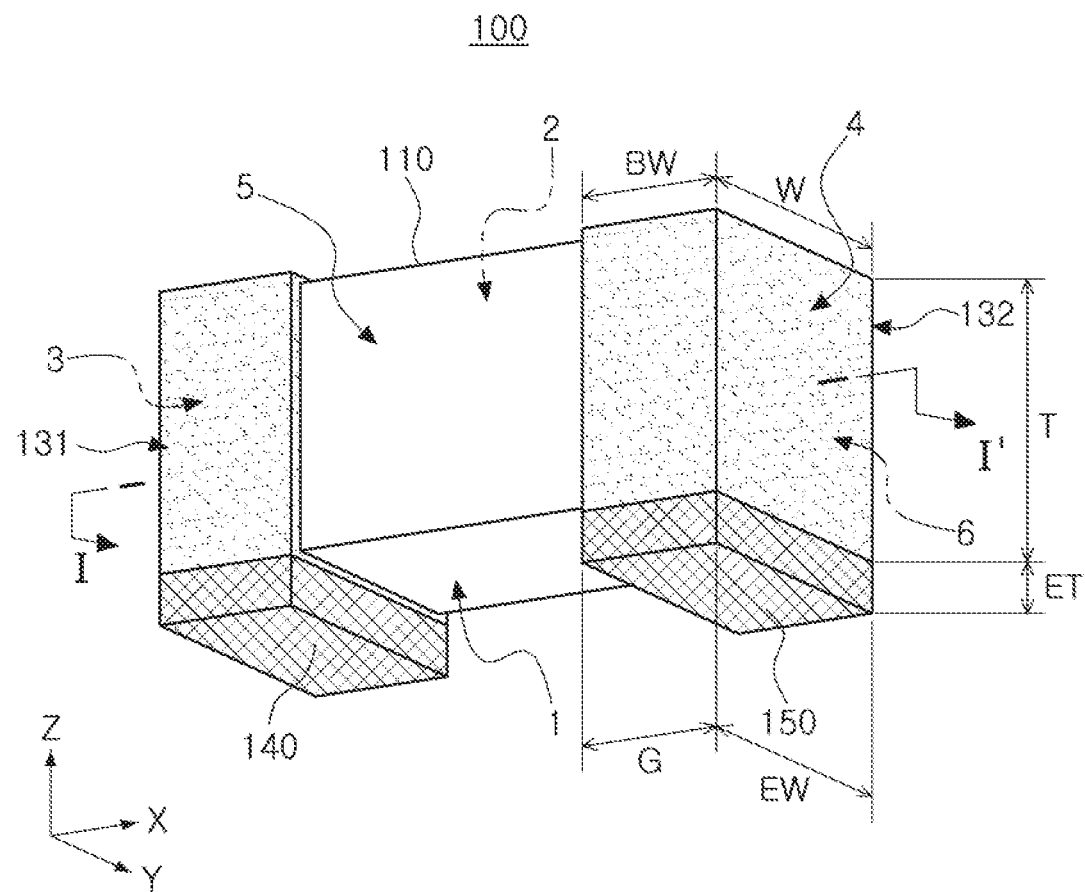
FIG. 1 is a schematic perspective view illustrating a multilayer electronic component according to an exemplary embodiment in the present disclosure.
Figure 2A:
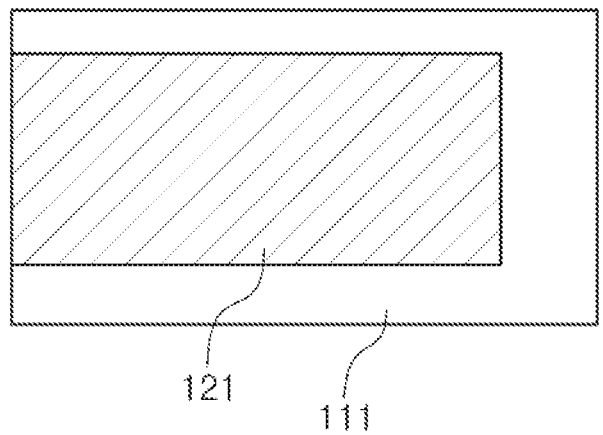
FIGS. 2A and 2B are plan views illustrating, respectively, first and second internal electrodes of a capacitor body of FIG. 1.
Figure 2B:
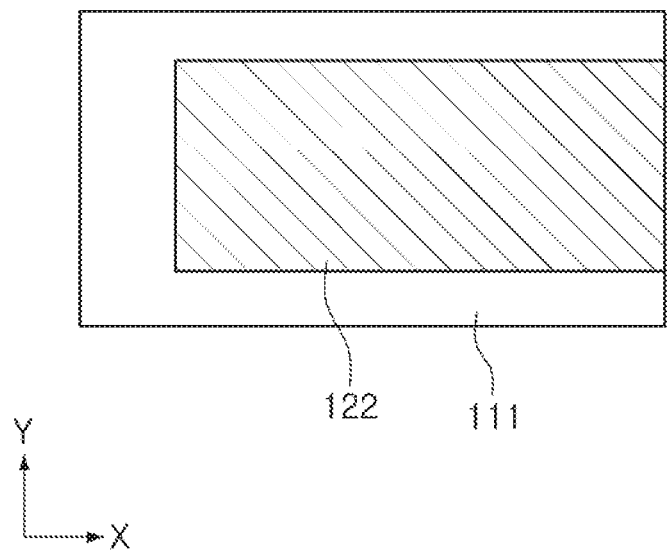
Figure 3:
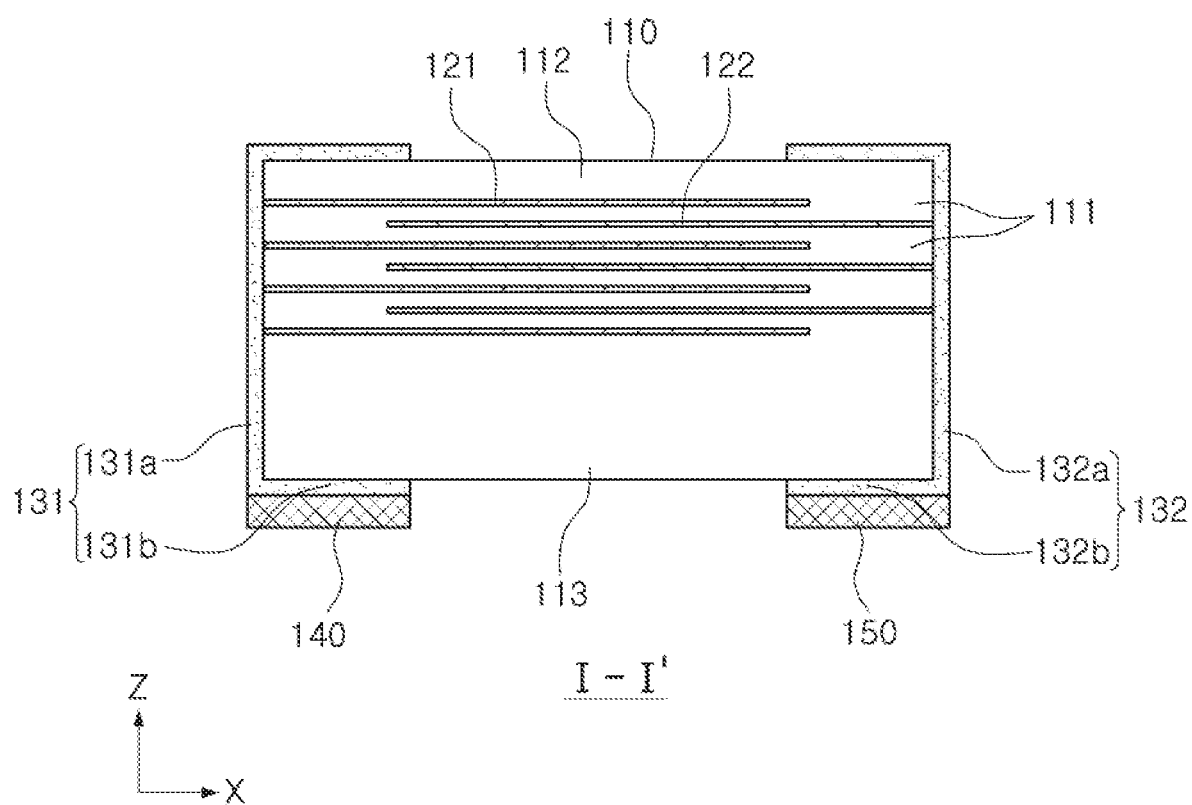
FIG. 3 is a cross-sectional view taken along line I-I' of FIG. 1.

FIG. 1 is a schematic perspective view illustrating a multilayer electronic component according to an exemplary embodiment in the present disclosure, FIGS. 2A and 2B are plan views illustrating, respectively, first and second internal electrodes of a capacitor body of FIG. 1, and FIG. 3 is a cross-sectional view taken along line I-I' of FIG. 1.

Referring to FIGS. 1 through 3, a multilayer electronic component 100 according to an exemplary embodiment in the present disclosure may include a capacitor body 110, first and second external electrodes 131 and 132, and first and second bump terminals 140 and 150.

The capacitor body 110 may be formed by stacking a plurality of dielectric layers 111 in a Z direction and then sintering the plurality of dielectric layers 111.

The capacitor body 110 may include an active region contributing to forming a capacitance of the multilayer electronic component and upper and lower cover regions 112 and 113 formed on opposite surfaces of the active region in the Z direction as upper and lower margin portions, respectively.

In the present exemplary embodiment, a thickness of the lower cover region 113 may be greater than that of the upper cover region 112.

In this case, inflection points formed on opposite surfaces of the capacitor body opposing each other may be formed on a level below the center of a thickness of the capacitor body due to a difference between a deformation rate generated in a central portion of the active region and a deformation rate generated in the lower cover region at the time of applying voltages to the multilayer electronic component, and acoustic noise may thus be reduced.

In addition, the upper and lower cover regions 112 and 113 may be formed of the same material as that of the dielectric layers 111 and have the same configuration as that of the dielectric layers 111 except that they do not include the internal electrodes.

The upper and lower cover regions 112 and 113 may be formed by stacking a single dielectric layer or two or more dielectric layers on upper and lower surfaces of the active region, respectively, in the Z direction, and may serve to prevent damage to internal electrodes of the active region due to physical or chemical stress.

Here, the respective adjacent dielectric layers 111 of the capacitor body 110 may be integrated with each other so that boundaries therebetween are not readily apparent.

In addition, the capacitor body 110 may have a hexahedral shape. However, a shape of the capacitor body 110 is not limited thereto.

In the present exemplary embodiment, for convenience of explanation, first and second surfaces 1 and 2 of the capacitor body 110 refer to opposite surfaces of the capacitor body 110 opposing each other in the Z direction in which the dielectric layers 111 are stacked, third and fourth surfaces 3 and 4 of the capacitor body 110 refer to opposite surfaces of the capacitor body 110 connected to the first and second surfaces 1 and 2 and opposing each other in an X direction, and fifth and sixth surfaces 5 and 6 of the capacitor body 110 refer to opposite surfaces of the capacitor body 110 connected to the first and second surfaces 1 and 2, connected to the third and fourth surfaces 3 and 4, and opposing each other in a Y direction. In this case, the first surface 1 of the capacitor body 110 may be a mounting surface.

The dielectric layer 111 may include a ceramic material having a high dielectric constant, for example, barium titanate ($BaTiO_3$) based ceramic powders, or the like, but is not limited thereto.

An example of the barium titanate ($BaTiO_3$) based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, an example of the barium titanate ($BaTiO_3$) based ceramic powder is not limited thereto.

Meanwhile, the dielectric layer 111 may further include a ceramic additive, an organic solvent, a plasticizer, a binder, a dispersant, and the like, in addition to the ceramic powders.

As the ceramic additive, for example, a transition metal oxide or carbide, a rare earth element, magnesium (Mg), aluminum (Al), or the like, may be used.

First and second internal electrodes 121 and 122 may be formed on ceramic sheets forming the dielectric layers 111, stacked, and then sintered to be thus alternately disposed in the active region of the capacitor body 110 with each of the dielectric layers 111 interposed therebetween.

The first and second internal electrodes 121 and 122, a pair of electrodes having different polarities, may be disposed to face each other in a direction in which the dielectric layers 111 are stacked and may be electrically insulated from each other by each of the dielectric layers 111 disposed therebetween.

One end portions of the first and second internal electrodes 121 and 122 may be exposed through the third and fourth surfaces 3 and 4 of the capacitor body 110, respectively.

The end portions of the first and second internal electrodes 121 and 122 alternately exposed through the third and fourth surfaces 3 and 4 of the capacitor body 110, respectively, may be electrically connected to first and second external electrodes 131 and 132 on the third and fourth surfaces 3 and 4 of the capacitor body 110, respectively.

Here, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may be accumulated between the first and second internal electrodes 121 and 122 facing each other.

Here, a capacitance of the multilayer electronic component 100 may be in proportion to an area of a region in which the first and second internal electrodes 121 and 122 overlap each other in the direction in which the dielectric layers 111 are stacked in the active region.

The first and second external electrodes 131 and 132 may include first and second connected portions 131a and 132a and first and second band portions 131b and 132b, respectively.

The first and second connected portions 131a and 132a may be formed on the third and fourth surfaces 3 and 4 of the capacitor body 110, respectively, and may be electrically connected to the exposed end portions of the first and second internal electrodes 121 and 122, respectively.

The first and second band portions 131b and 132b may extend from the first and second connected portions 131a and 132a to portions of the first surface 1, the mounting surface of the capacitor body 110, respectively, In addition, the first and second band portions 131b and 132b, which are mounting surfaces of the external electrodes, may be connected to the first and second bump terminals 140 and 150, respectively.

In order to improve adhesion strength, the first and second external electrodes 131 and 132 may be further extended to portions of the second, fifth, and sixth surfaces 2, 5, and 6 of the capacitor body 110.

The first and second bump terminals 140 and 150 may be formed of insulators, and may be disposed on the first and second band portions 131b and 132b of the first and second external electrodes 131 and 132, respectively.

The first and second bump terminals 140 and 150 may be formed of, for example, insulation epoxy, or the like, and may primarily absorb piezoelectric vibrations transferred from the capacitor body 110 to a circuit board through elasticity of the insulation epoxy to reduce acoustic noise.

In addition, the first and second bump terminals 140 and 150 may have conductive layers formed on surfaces thereof. The conductive layers may serve to electrically connect the first and second external electrodes 131 and 132 and the circuit board to each other. The conductive layers may be formed by dipping a conductive paste or be formed as plating layers using plating.

Here, the first and second bump terminals 140 and 150 may absorb external force transferred from the circuit board to the capacitor body 110 to improve reliability of the multilayer electronic component 100.

In addition, the first and second bump terminals 140 and 150 may serve to allow the capacitor body 110 and the circuit board to be spaced apart from each other when the multilayer electronic component 100 is mounted on the circuit board.

That is, space portions may be formed between the capacitor body 110 and the circuit board to suppress a maximum displacement of the capacitor body 110 from being transferred to the circuit board, resulting in further suppression of generation of the acoustic noise.

In addition, the first and second bump terminals 140 and 150 may reduce a height of solder fillets by a height of the first and second bump terminals at the time of mounting the multilayer electronic component on the circuit board to reduce transfer amounts of vibration displacement of the third and fourth surfaces of the capacitor body, resulting in further suppression of generation of the acoustic noise.

In the present exemplary embodiment, each of the first and second bump terminals 140 and 150 may be formed to be elongate in a W direction, and may have a length that is equal to or smaller than that of each of the first and second band portions 131b and 132b in the W direction.

When the length of each of the first and second bump terminals 140 and 150 in the W direction is greater than that of each of the first and second band portions 131b and 132b in the W direction, it may not be easy to manufacture the bump terminals, such that an entire size of the multilayer electronic component needs to be increased.

In addition, in the present exemplary embodiment, $BW/3 \leq G \leq BW$ and $T/5 < ET < T/2$ in which BW is a width of each of the first and second band portions 131b and 132b, T is a thickness of each of the first and second connected portions 131a and 132, G is a width of each of the first and second bump terminals 140 and 150, and ET is a thickness of each of the first and second bump terminals 140 and 150.

When the width G of each of the first and second bump terminals 140 and 150 is less than 1/3 of the width BW of each of the first and second band portions 131b and 132b, a phenomenon in which the multilayer electronic component 100 mounted on the circuit board collapses may occur, and adhesion strength between the first and second band portions and the circuit board may not be sufficiently secured due to an excessively small size of the bump terminals, such that the first and second bump terminals 140 and 150 may not appropriately perform roles of the bump terminals.

In addition, when G exceeds BW, an area in which vibrations are transferred may be increased, and a position at which a maximum displacement amount is generated in the capacitor body and positions of the bump terminals may become excessively close to each other. Therefore, it may be difficult to appropriately implement an effect of suppressing the vibrations from being transferred from the capacitor body.

Table 1 represents a change in acoustic noise depending on a ratio between G and BW. Here, a length, a width, and a thickness of the capacitor body are set to 1.13 mm, 0.656 mm, and 0.672 mm, respectively, and bump terminals having ETs of 150 μm, 200 μm, and 250 μm are used.

TABLE 1

| Ratio of G to BW | Acoustic noise (dB) |
| --- | --- |
| 1/3 | 28.3 |
| 1/2 | 32 |
| 1 | 35.3 |
| 1.3 | 36.5 |
| 1.5 | 37.8 |
| No Bump Terminal | 40 |

It may be confirmed from Table 1 that as G is increased, positions of the bump terminals become close to a position at which a maximum displacement amount is generated in the capacitor body, such that acoustic noise is increased.

Table 2 represents a change in acoustic noise depending on a ratio between ET and T.

TABLE 2

| Ratio of ET to T | Acoustic noise (dB) |
| --- | --- |
| No Bump Terminal | 40 |
| 1/6 | 38.9 |
| 1/5 | 37.8 |
| 3/10 | 36.5 |
| 2/5 | 32.0 |

TABLE 2-continued

| Ratio of ET to T | Acoustic noise (dB) |
|---|---|
| 1/2 | 28.3 |
| 2/3 | 27.8 |

Referring to Table 2, as T becomes small, an acoustic noise reducing effect may be reduced, and as T is increased, the acoustic noise reducing effect may be increased, but in this case, a size of the multilayer electronic component may be increased.

In addition, when the thickness ET of each of the first and second bump terminals 140 and 150 is T/5 or less or T/2 or more, a piezoelectric vibration absorbing effect may be reduced, and an effect of suppressing a vibration displacement from being transferred through solders may be reduced. When ET is T/2 or more, a size of the multilayer electronic component may be excessively increased, such that it may not satisfy a standard.

In the present exemplary embodiment, W/2<EW<W in which W is a width of each of the first and second connected portions 131a and 132a and EW is a length of each of the first and second bump terminals 140 and 150.

When the length EW of each of the first and second bump terminals 140 and 150 is the width W or more of each of the first and second connected portions 131a and 132a or is W/2 or less, a phenomenon in which the multilayer electronic component 100 mounted on the circuit board collapses may occur.

Figure 4:
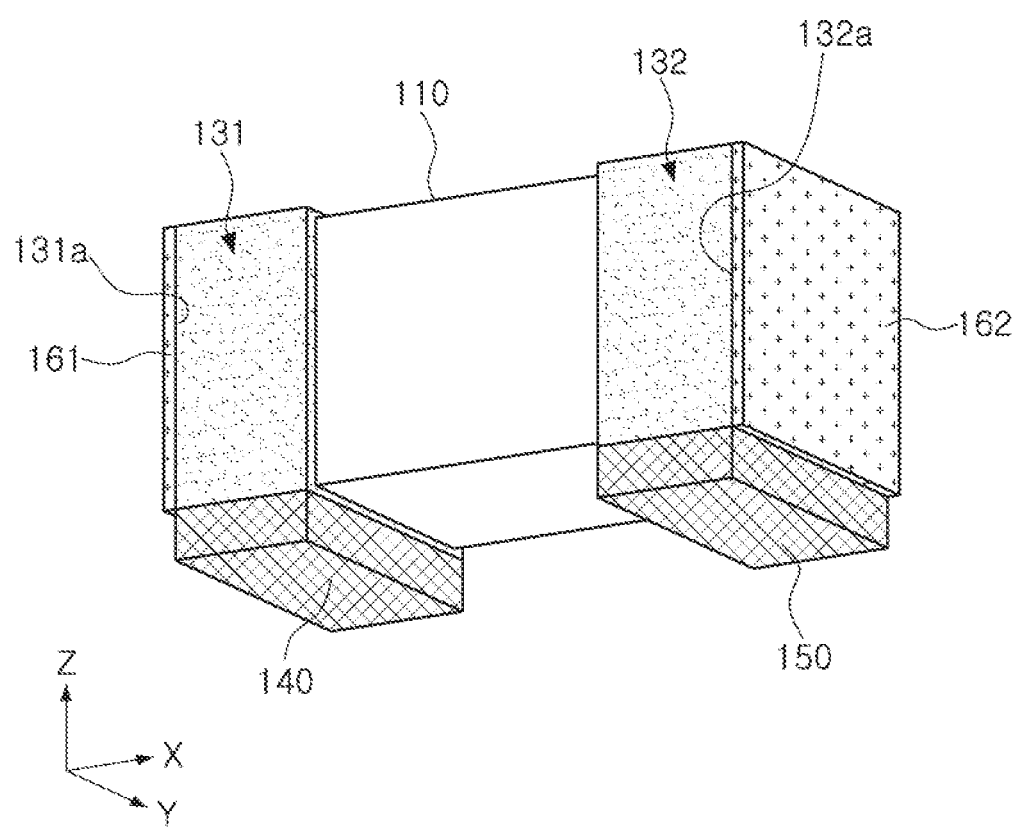
FIG. 4 is a perspective view illustrating the multilayer electronic component of FIG. 1 in which insulating layers are further disposed.

Referring to FIG. 4, the multilayer electronic component 100 according to the present disclosure may further include first and second insulating layers 161 and 162.

The first and second insulating layers 161 and 162 may be disposed on the first and second connected portions 131a and 132a of the first and second external electrodes 131 and 132, respectively.

The first and second insulating layers 161 and 162 may be formed of a material such as a non-conductive insulating resin. For example, the insulating resin may be epoxy, a phenol based thermosetting resin, polypropylene, an acrylic thermoplastic resin, or the like, but is not limited thereto.

The first and second insulating layers 161 and 162 may serve to reduce heights of solder fillets by suppressing solders from being formed on the first and second connected portions 131a and 132a at the time of mounting the multilayer electronic component 100 on the circuit board.

In addition, when the plurality of multilayer electronic components are mounted on a narrow circuit board, the first and second insulating layers 161 and 162 may serve to improve circuit stability of an entire product by preventing generation of a short-circuit even though the multilayer electronic components mounted on the circuit board are in contact with each other.

Figure 5:
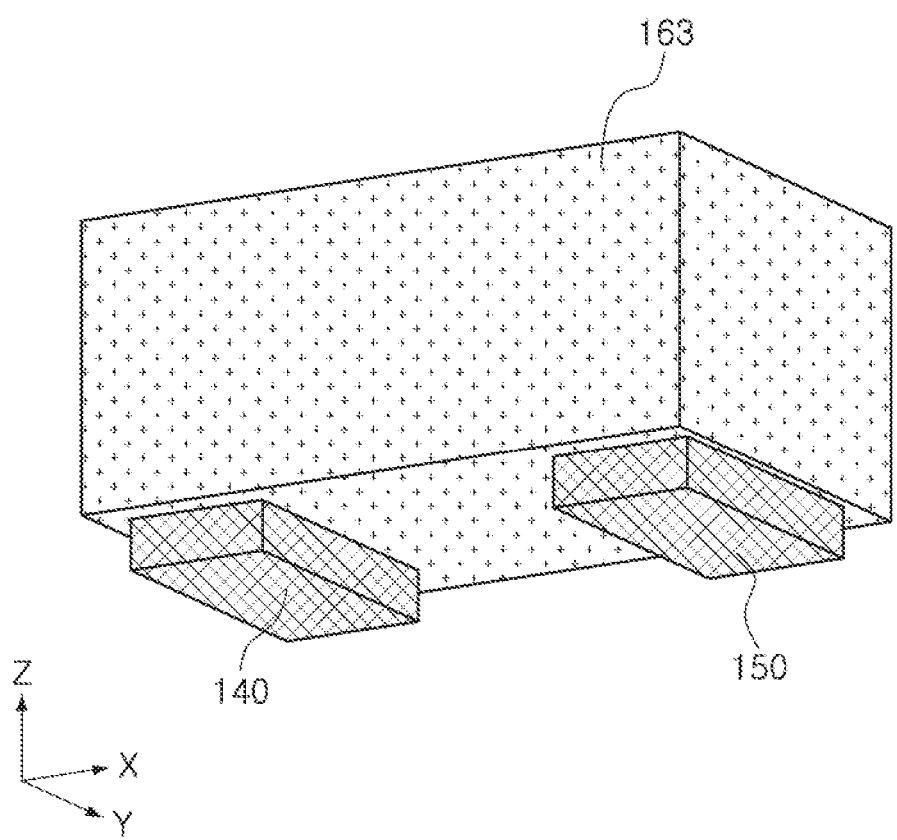
FIG. 5 is a perspective view illustrating the multilayer electronic component of FIG. 1 in which an encapsulating portion is further formed.

Referring to FIG. 5, the multilayer electronic component 100 according to the present disclosure may further include an encapsulating portion 163.

The encapsulating portion 163 may cover the capacitor body 110 and the first and second external electrodes 131 and 132, and externally expose only the first and second bump terminals 140 and 150.

The encapsulating portion 163 may be formed of a material such as a non-conductive insulating resin. For example, the insulating resin may be epoxy, a phenol based thermosetting resin, polypropylene, an acrylic thermoplastic resin, or the like, but is not limited thereto.

The encapsulating portion 163 may serve to reduce heights of solder fillets by suppressing solders from being formed on portions except for the first and second bump terminals 140 and 150 at the time of mounting the multilayer electronic component 100 on the circuit board.

In addition, when the plurality of multilayer electronic components are mounted on a narrow circuit board, the encapsulating portion 163 may serve to improve circuit stability of an entire product by preventing generation of a short-circuit even though the multilayer electronic components mounted on the circuit board are in contact with each other.

The encapsulating portion 163 may be formed at a size greater than those of the capacitor body 110 and the first and second bump terminals 140 and 150. Therefore, the first and second bump terminals 140 and 150 may be spaced apart from edges of the encapsulating portion 163 on a lower surface of the encapsulating portion 163 in the Z direction. Therefore, gaps between the edges of the encapsulating portion 163 and the first and second bump terminals 140 and 150 may serve as solder pockets.

Figure 6:
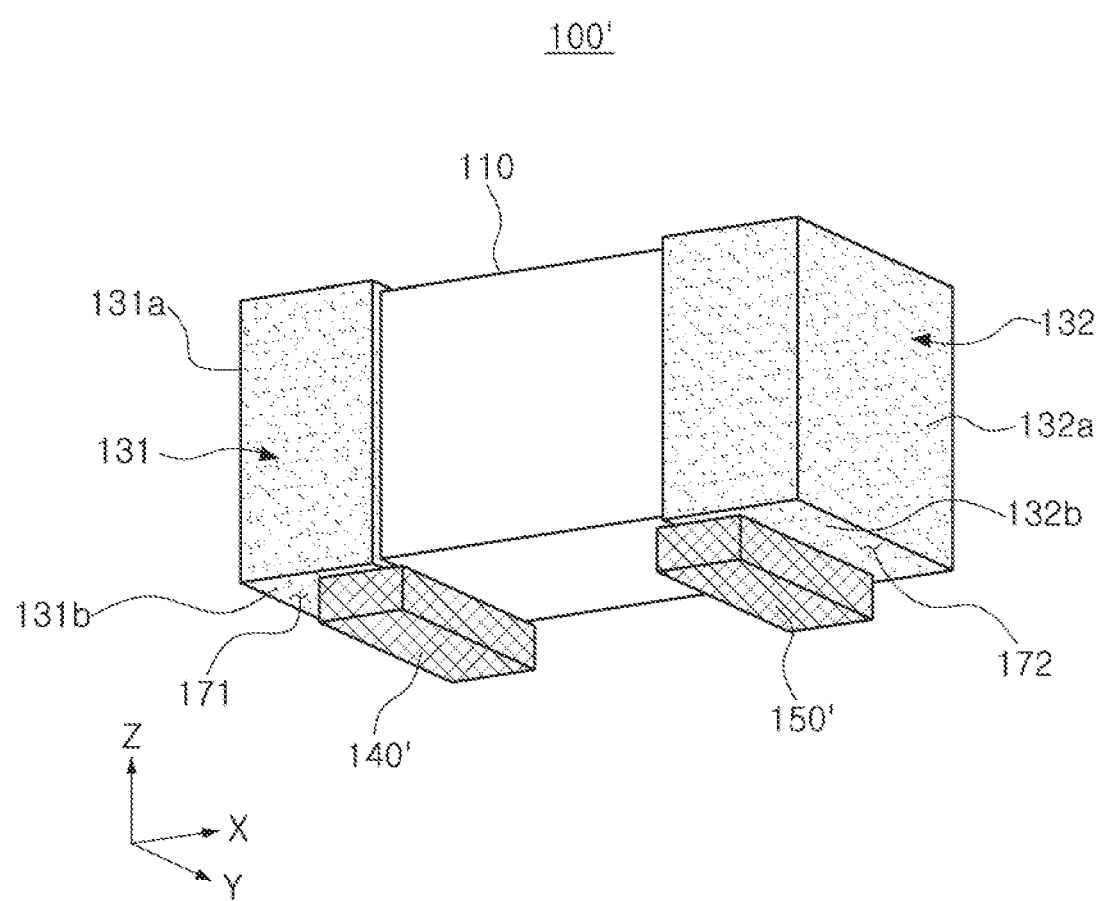
FIG. 6 is a schematic perspective view illustrating a multilayer electronic component according to another exemplary embodiment in the present disclosure.

FIG. 6 is a schematic perspective view illustrating a multilayer electronic component 100' according to another exemplary embodiment in the present disclosure.

Here, since structures of a capacitor body 110 and first and second external electrodes 131 and 132 are similar to those of the capacitor body 110 and the first and second external electrodes 131 and 132 according to the exemplary embodiment described above, a detailed description therefor is omitted in order to avoid an overlapped description, and first and second bump terminals 140' and 150' having structures different from those of the first and second bump terminals 140 and 150 according to the exemplary embodiment described above are illustrated and described in detail.

Referring to FIG. 6, the first and second bump terminals 140' and 150' may be positioned more toward the center of the capacitor body 110 to be thus disposed to be spaced apart from the first and second connected portions 131a and 132a, respectively.

That is, the first and second bump terminals 140' and 150' may be disposed to be biased toward the center of the capacitor body 110 in the X direction, and step portions 171 and 172 may be thus provided outside the first and second bump terminals 140' and 150', respectively, in the X direction.

First and second solder accommodating portions may be provided on the first and second band portions 131b and 132b by the step portions 171 and 172, respectively.

The solder accommodating portions may serve as solder pockets in which solders are accommodated to serve to reduce heights of solder fillets, at the time of mounting the multilayer electronic component on the circuit board.

Figure 7:
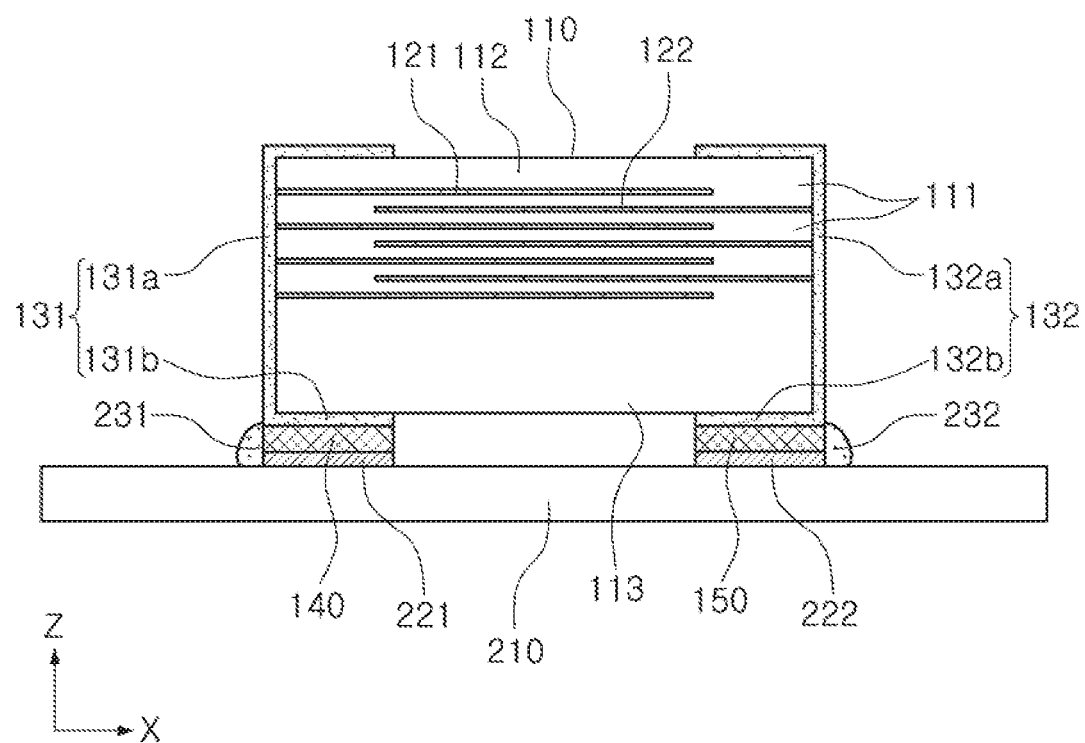
FIG. 7 is a schematic cross-sectional view illustrating a state in which the multilayer electronic component of FIG. 1 is mounted on a circuit board.

FIG. 7 is a schematic cross-sectional view illustrating a state in which the multilayer electronic component of FIG. 1 is mounted on a circuit board.

The multilayer electronic component 100 may be bonded and electrically connected to a circuit board 210 by solders 231 and 232 in a state in which the first and second bump terminals 140 and 150 formed on the mounting surface of the capacitor body 110 are positioned on first and second electrode pads 221 and 222 of the circuit board 210, respectively, to be in contact with the electrode pads 221 and 222, respectively.

When voltages having different polarities are applied to the first and second external electrodes 131 and 132 formed on opposite end surfaces of the multilayer electronic component 100 in a state in which the multilayer electronic component 100 is mounted on the circuit board 210 as described above, the capacitor body 110 may be expanded and contracted in a thickness direction due to an inverse piezoelectric effect of the dielectric layers 111, and both end portions of the first and second external electrodes 131 and 132 may be contracted and expanded as opposed to the expansion and the contraction of the capacitor body 110 in the thickness direction due to a Poisson effect.

Such a contraction and expansion may generate vibrations. In addition, the vibrations may be transferred from the first and second external electrodes 131 and 132 to the circuit board 210, and sound may thus be radiated from the circuit board 210, which becomes the acoustic noise.

According to the present exemplary embodiment, the piezoelectric vibrations transferred to the circuit board through the first and second external electrodes 131 and 132 of the multilayer electronic component 100 may be absorbed using elasticity of the first and second bump terminals 140 and 150, and acoustic noise may thus be primarily reduced.

In addition, in a board having a multilayer electronic component according to the present exemplary embodiment, the capacitor body 110 may be spaced apart from the first and second electrode pads 221 and 222 of the circuit board 210 by the first and second bump terminals 140 and 150 by a predetermined distance.

Therefore, unlike a case in which a multilayer electronic component according to the related art is mounted, heights of the solders 231 and 232 formed on the capacitor body 110 and the first and second external electrodes 131 and 132 may be significantly reduced.

Therefore, when the heights of the solders 231 and 232 are significantly reduced, elastic force of the first and second bump terminals 140 and 150 may efficiently act to suppress the vibrations generated from the multilayer electronic component 100 from being transferred to the circuit board 210, resulting in reduction of the acoustic noise.

As set forth above, according to the exemplary embodiments in the present disclosure, the bump terminals may be formed to be spaced apart from each other so that empty spaces are formed on the mounting surface of the capacitor body, and may absorb the vibrations transferred from the external electrodes to the circuit board and limit the heights of the solders at the time of mounting the multilayer electronic component on the circuit board, such that the acoustic noise and the high frequency vibrations in the high frequency region of 20 kHz or more of the multilayer electronic component may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a capacitor body having first and second surfaces opposing each other in a thickness direction and third and fourth surfaces connected to the first and second surfaces and opposing each other in a length direction, and including an active region including first and second internal electrodes disposed to be alternately exposed through the third and fourth surfaces, respectively, with respective dielectric layers interposed therebetween and upper and lower cover regions disposed on upper and lower surfaces of the active region, respectively;
first and second external electrodes including, respectively, first and second connected portions disposed on the third and fourth surfaces of the capacitor body, respectively, and connected to the first and second internal electrodes, respectively, and first and second band portions extending from the first and second connected portions to portions of the first surface; and
first and second bump terminals formed of insulators, having conductive layers formed on surfaces thereof, and disposed on the first and second band portions, respectively,
wherein $BW/3 \leq G \leq BW$ and $1/5 < ET/T < 1/2$, where BW is a dimension of each of the first and second band portions in the length direction, T is a dimension in the thickness direction of each of the first and second external electrodes extending along the third and fourth surfaces, respectively, G is a dimension of each of the first and second bump terminals in the length direction, and ET is a dimension of each of the first and second bump terminals in the thickness direction.

2. The multilayer electronic component of claim 1, wherein the lower cover region has a thickness greater than that of the upper cover region.

3. The multilayer electronic component of claim 2, wherein the thickness of the lower cover region is less than two times of that of the upper cover region.

4. The multilayer electronic component of claim 1, wherein the first external electrode extends to portions of the second surface and fifth and sixth surfaces of the capacitor body, and the second external electrode extends to portions of the second, fifth, and sixth surfaces of the capacitor body.

5. The multilayer electronic component of claim 1, further comprising first and second insulating layers disposed on the first and second connected portions, respectively.

6. The multilayer electronic component of claim 1, further comprising an encapsulating portion covering the capacitor body and the first and second external electrodes.

7. The multilayer electronic component of claim 1, wherein the first and second bump terminals are disposed to be spaced apart from the first and second connected portions, respectively.

8. The multilayer electronic component of claim 7, further comprising step portions on the first and second band portions between the first and second bump terminals and the first and second connected portions, respectively.

9. The multilayer electronic component of claim 1, wherein $W/2 < EW < W$, where W is a dimension of each of the first and second connected portions in a width direction and EW is a dimension of each of the first and second bump terminals in the width direction.

10. The multilayer electronic component of claim 1, wherein the conductive layers are formed by plating.

11. The multilayer electronic component of claim 1, wherein the first and second bump terminals are formed of insulation epoxy.

12. A board having a multilayer electronic component, comprising:
a circuit board having first and second electrode pads disposed thereon; and
the multilayer electronic component of claim 1 disposed on the circuit board so that the first and second bump terminals are connected to the first and second electrode pads, respectively.

13. The multilayer electronic component of claim 1, wherein portions of the first and second external electrodes disposed on the third and fourth surfaces are free of the insulators of the first and second bump terminals.

14. The multilayer electronic component of claim 1, wherein the insulators of the first and second bump terminals are disposed directly on the first and second band portions of the first and second external electrodes, respectively, over the entire extent BW of each of the first and second band portions in the length direction.

15. A multilayer electronic component comprising:
a capacitor body having first and second surfaces opposing each other in a thickness direction and third and fourth surfaces connected to the first and second surfaces and opposing each other in a length direction, and including an active region including first and second internal electrodes disposed to be alternately exposed through the third and fourth surfaces, respectively, with respective dielectric layers interposed therebetween and upper and lower cover regions disposed on upper and lower surfaces of the active region, respectively;
first and second external electrodes including, respectively, first and second connected portions disposed on the third and fourth surfaces of the capacitor body, respectively, and connected to the first and second internal electrodes, respectively, and first and second band portions extending from the first and second connected portions to portions of the first surface; and
first and second bump terminals disposed on the first and second band portions, respectively,
wherein the first and second bump terminals are spaced apart from the third and fourth surfaces of the capacitor body, respectively, and
wherein $BW/3 \leq G \leq BW$ and $1/5 < ET/T < 1/2$, where BW is a dimension of each of the first and second band portions in the length direction, T is a dimension in the thickness direction of each of the first and second external electrodes extending along the third and fourth surfaces, respectively, G is a dimension of each of the first and second bump terminals in the length direction, and ET is a dimension of each of the first and second bump terminals in the thickness direction.

16. The multilayer electronic component of claim 15, wherein the first and second bump terminals are formed of insulators and have conductive layers formed on surfaces thereof.

17. The multilayer electronic component of claim 15, wherein $W/2 < EW < W$, where W is a dimension of each of the first and second connected portions in a width direction and EW is a dimension of each of the first and second bump terminals in the width direction.

18. The multilayer electronic component of claim 15, wherein portions of the first and second external electrodes disposed on the third and fourth surfaces are free of the first and second bump terminals.

19. The multilayer electronic component of claim 15, wherein the first and second bump terminals are disposed directly on the first and second band portions of the first and second external electrodes, respectively, over the entire extent BW of each of the first and second band portions in the length direction.

* * * * *